(12) United States Patent
Sander

(10) Patent No.: US 6,700,428 B2
(45) Date of Patent: Mar. 2, 2004

(54) CIRCUIT CONFIGURATION WITH A CONTROLLABLE CURRENT LIMITING CIRCUIT FOR DRIVING A LOAD

(75) Inventor: Rainald Sander, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/013,230

(22) Filed: Dec. 10, 2001

(65) Prior Publication Data

US 2002/0079944 A1 Jun. 27, 2002

(30) Foreign Application Priority Data

Dec. 9, 2000 (DE) .......................... 100 61 371

(51) Int. Cl.[7] ................................. H03K 5/08
(52) U.S. Cl. ................... 327/312; 327/320; 327/322; 327/324
(58) Field of Search ................ 327/309, 312, 327/318–324, 330–332

(56) References Cited

U.S. PATENT DOCUMENTS 4,658,203 A 4/1987 Freymuth .................... 323/282
5,379,178 A 1/1995 Graf et al. ................... 361/152
5,495,198 A * 2/1996 Chen ........................... 327/326
6,204,717 B1 * 3/2001 Nagasu et al. ............... 327/318

FOREIGN PATENT DOCUMENTS

DE 40 29 794 A1 2/1992
WO WO 94/10753 5/1994

* cited by examiner

*Primary Examiner*—Kenneth B. Wells
(74) *Attorney, Agent, or Firm*—Laurence A. Greenberg; Werner H. Stemer; Gregory L. Mayback (57) ABSTRACT

A circuit configuration for driving a load is described. The circuit configuration has a first and a second connecting terminal for connecting the load, a first drive input for applying a first drive signal, and a first semiconductor switching element having a first load terminal connected to the first connecting terminal, a second load terminal connected to the second connecting terminal and a drive terminal coupled to the drive input. A voltage limiting circuit is provided and is connected between the first load terminal and the drive terminal of the first semiconductor switching element.

11 Claims, 6 Drawing Sheets

CIRCUIT CONFIGURATION WITH A CONTROLLABLE CURRENT LIMITING CIRCUIT FOR DRIVING A LOAD

BACKGROUND OF THE INVENTION

Field of the Invention

The present invention relates to a circuit configuration for driving a load. The circuit configuration contains a first connecting terminal for connecting to the load, a second connecting terminal, a first drive input for receiving a first drive signal, and a semiconductor switching element having a first load terminal connected to the first connecting terminal, a second load terminal connected to the second connecting terminal, and a drive terminal coupled to the first drive input. A voltage limiting circuit is connected between the first load terminal and the drive terminal of the semiconductor switching element.

U.S. Pat. No. 4,658,203 discloses a circuit configuration for driving a motor, which has a power MOSFET whose load path (drain-source path) is connected between a connecting terminal of the motor and ground. In this case, the gate terminal of the MOSFET is connected to a pulse width modulator for driving the MOSFET. In order to limit the voltage across the load path of the MOSFET, a reverse-biased zener diode is connected between the drain terminal and the gate terminal of the MOSFET. If the potential at the drain terminal of the MOSFET exceeds a predetermined value which is dependent on the breakdown voltage of the zener diode, then the zener diode turns on and charges the gate capacitance of the MOSFET, as a result of which the MOSFET turns on and as a result of which the voltage across the load path thereof is limited. In this case, the zener diode is dimensioned in such a way that it turns on in order to drive the MOSFET before the breakdown voltage of the transistor is reached.

For switching loads it is known, moreover, to use so-called smart power FETs. Components of this type contain, in addition to a power transistor, inter alia a protective circuit for the power transistor that is intended to protect the power transistor against, for example, an excessively large load current or an excessively high temperature. The protective circuit usually has a switch which is connected to the gate terminal of the power transistor and serves for discharging the gate capacitance of the transistor in order to turn off the transistor if, for example, the load current of the transistor or the temperature thereof assumes a value at which there is the risk of the transistor being damaged.

If a power transistor for driving a load contains a protective circuit with a switch for discharging the gate capacitance and also a zener diode for voltage limiting, then the situation can arise wherein the switch of the protective circuit turns on in order to turn off the power transistor, and wherein, at the same time, the zener diode turns on in order to drive the power transistor and thereby to limit the voltage across the load path thereof. Whereas only a short current pulse flows through the zener diode, in order to charge the gate capacitance, when the switch of the protective circuit is turned off, a current flows permanently through the zener diode when the switch of the protective circuit is turned on and the zener diode is turned on. Due to an unavoidable internal resistance of the zener diode or of another voltage limiting circuit, which may be not inconsiderable particularly in the case of integrated zener diodes, there is then the risk that, on account of the voltage drop which is additionally brought about across the zener diode and results from the product of the flowing current and the internal resistance, the drain potential of the power transistor will rise to a value at which the power transistor is in danger of destruction.

In addition, the MOSFET turns off rapidly if its gate capacitance is discharged by the protective circuit. In this case, inductive loads or else only the inductance of the leads can give rise to high induced voltages in the leads which can reach the level of the breakdown voltage of the MOSFET.

SUMMARY OF THE INVENTION

It is accordingly an object of the invention to provide a circuit configuration with a controllable current limiting circuit for driving a load which overcomes the above-mentioned disadvantages of the prior art devices of this general type, in which it is possible to use a semiconductor switching element with a protective circuit, in particular with a protective circuit against an over temperature or for current limiting, and wherein the semiconductor switching element is additionally protected against an over-voltage on its load path.

With the foregoing and other objects in view there is provided, in accordance with the invention, a circuit configuration for driving a load. The circuit configuration has a first connecting terminal for connecting to the load, a second connecting terminal, a first drive input for receiving a first drive signal, and a semiconductor switching element having a first load terminal connected to the first connecting terminal, a second load terminal connected to the second connecting terminal, and a drive terminal coupled to the first drive input. A voltage limiting circuit is connected between the first load terminal and the drive terminal of the semiconductor switching element. The voltage limiting circuit has a second drive input receiving a second drive signal, and a threshold voltage of the voltage limiting circuit is dependent on the second drive signal.

The second drive signal may be variable for example depending on the switching state of the first semiconductor switching element, a temperature in the region of the first semiconductor switching element or a current through the first semiconductor switching element. The voltage limiting circuit is configured in such a way that a threshold voltage of the voltage limiting circuit is reduced in the case of those states of the first semiconductor switching element in which the voltage limiting circuit can permanently take up a current or in which it is possible for the semiconductor switch to be switched off rapidly by a protective circuit. This prevents the situation in which, as a result of a rise in the voltage across the voltage limiting circuit which results from a voltage drop brought about by a permanent current at an internal resistance of the voltage limiting circuit, the potential at the first load terminal of the first semiconductor switching element rises to a value at which the first semiconductor switching element is in danger of destruction. A situation in which the voltage limiting circuit permanently takes up current can arise when a protective circuit is present which short-circuits the drive terminal and the second load terminal of the first semiconductor switching element in the overload case, in order to turn off the first semiconductor switching element.

If the switch is in a state in which a rapid switch-off by a protective circuit can occur, then the threshold voltage of the voltage limiting circuit is preferably likewise reduced. In this case, the voltage limiting circuit counteracts the protective circuit and, upon commencement of the protective circuit, from the point when the reduced threshold voltage is reached, prevents the gate capacitance from being discharged too rapidly and thereby prevents high induced voltages on the load path of the MOSFET.

One embodiment of the circuit configuration according to the invention provides for the voltage limiting circuit to have a series circuit containing a first and a second voltage limiting element, it being possible for one of the voltage limiting elements to be short-circuited according to the second drive signal. In order to short-circuit the one voltage limiting element, in one embodiment of the invention, a switch, in particular a semiconductor switching element, is connected in parallel with the voltage limiting element, the switch having a drive terminal to which the second drive signal is fed. The series-connected voltage limiting elements are preferably zener diodes, which have the advantage that they can be integrated in a simple manner in the same semiconductor body as the first semiconductor switching element.

Depending on the switch position of the second switch, the voltage limiting circuit according to the invention has a breakdown voltage that corresponds to the sum of the breakdown voltages of the two voltage limiting elements or the breakdown voltage of the voltage limiting element which cannot be short-circuited.

In one embodiment of the invention, the second drive signal is dependent on a switching state of the first semiconductor switching element. As a result, a high breakdown voltage of the voltage limiting circuit can be set in the case of a first switching state, in which the first semiconductor switching element turns off, whereas a lower breakdown voltage of the voltage limiting circuit is set in the case of a second switching state, in which the first semiconductor switching element turns on. In the case of the switching state mentioned last, given the presence of a protective circuit which serves for turning off the first semiconductor switching element in an overload case, the situation can arise wherein a current permanently flows through the voltage limiting circuit, since part of the current through the voltage limiting circuit which is intended to turn on the first semiconductor switching element is taken up by the protective circuit. The protective circuit is used to achieve an opposite aim, namely to turn off the first semiconductor switching element. Due to an internal resistance that is inevitably present in the voltage limiting circuit, in the event of a permanent current flow through the voltage limiting circuit, the voltage across the voltage limiting circuit rises. The voltage limiting circuit has a breakdown voltage that is reduced in this case, however, and this prevents the voltage across the load path of the first semiconductor switching element from rising to a value at which the first semiconductor switching element is in danger of destruction.

One embodiment of the invention provides a protective circuit with a third semiconductor switching element, the third semiconductor switching element is connected between the control terminal of the first semiconductor switching element and the second load path terminal thereof. The third semiconductor switching element serves for turning off the first semiconductor switching element according to a drive signal, in that it short-circuits the drive terminal and the second load path terminal. In this case, the drive signal of the third semiconductor switching element is preferably dependent on a temperature in the region of the first semiconductor switching element and/or on a load current of the first semiconductor switching element.

A second embodiment of the invention provides for the second drive signal to be dependent on a temperature in the region of the first semiconductor switching element. As a result, the breakdown voltage of the voltage limiting circuit can be reduced for example when the temperature in the region of the first semiconductor switching element exceeds a predetermined value at which a protective circuit reacts in order to turn off the first semiconductor switching element. In this case, too, the protective circuit pursues an opposite aim to that of the voltage limiting circuit, namely the aim of turning off the first semiconductor switching element, which results in a permanent current flow through the voltage limiting circuit. The reduced breakdown voltage of the voltage limiting circuit in this case prevents the breakdown voltage of the first semiconductor switching element from being reached, the first semiconductor element being in danger of destruction at the breakdown voltage.

In a corresponding manner, a further embodiment of the invention provides for the second drive signal to be dependent on a current through the first semiconductor switching element. In this case, if the current through the first semiconductor switching element exceeds a value at which a protective circuit switches on for the purpose of turning off the first semiconductor switching element, then, as in the over-temperature case described above, the breakdown voltage of the voltage limiting circuit is reduced in order to intercept the voltage rise across the voltage limiting circuit, the voltage rise being brought about in the event of a permanent current flow, and to prevent the breakdown voltage of the first semiconductor switching element from being reached.

The voltage limiting circuit preferably has a drive circuit for driving the second switch connected in parallel with the first voltage limiting element, the drive circuit being fed a current signal which is dependent on the current through the first semiconductor switching element, and/or a temperature signal which is dependent on the temperature in the region of the first semiconductor switching element. In this case, for the provision of the current signal, a current sensor is connected in series with the first semiconductor switching element and, for the provision of the temperature signal, a temperature sensor is disposed in the region of the first semiconductor switching element.

Other features which are considered as characteristic for the invention are set forth in the appended claims.

Although the invention is illustrated and described herein as embodied in a circuit configuration with a controllable current limiting circuit for driving a load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
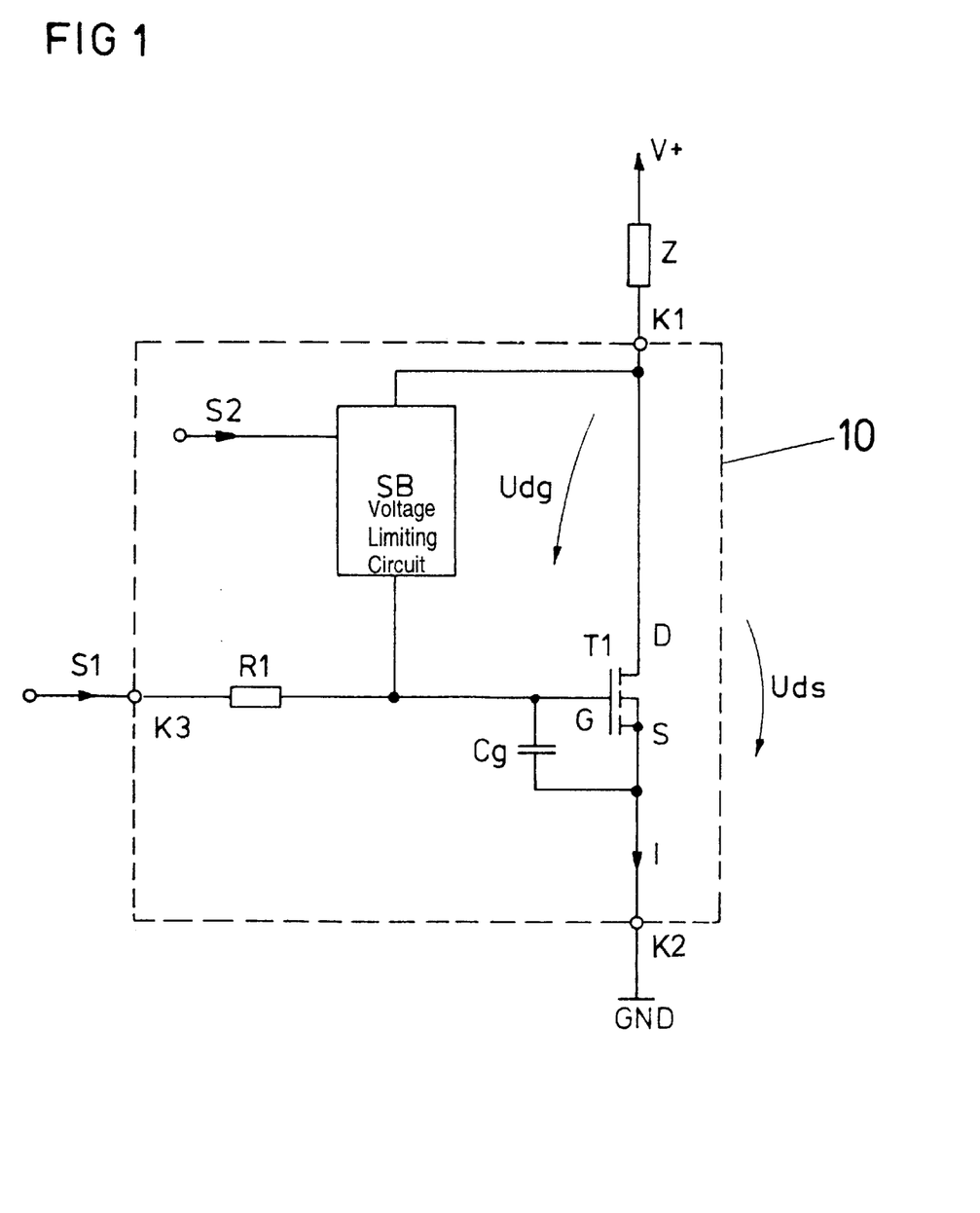
FIG. 1 is a circuit diagram of a circuit configuration having a voltage limiting circuit for driving a load in accordance with a first embodiment of the invention.

In all the figures of the drawing, sub-features and integral parts that correspond to one another bear the same reference symbol in each case. Referring now to the figures of the drawing in detail and first, particularly, to FIG. 1 thereof, there is shown a first exemplary embodiment of a circuit configuration 10 according to the invention for connecting a load Z to a supply potential V+, GND. The circuit configuration 10 has a first connecting terminal K1, which, in order to illustrate the function of the circuit configuration in FIG. 1, is connected to the load Z. A terminal of the load Z that is remote from the connecting terminal K1 is connected to a first supply potential V+. The circuit configuration 10 has a second connecting terminal K2, which is connected to a second supply potential GND in FIG. 1. In addition to the first and second connecting terminals K1, K2, a drive input K3 is present, for feeding in a drive signal S1.

The circuit configuration 10 contains a first semiconductor switching element T1, which is configured as an n-channel power MOSFET in the exemplary embodiment. The transistor T1 has a drain terminal as a first load path terminal, which is connected to the first connecting terminal K1, and the transistor T1 has a source terminal as a second load path terminal, which is connected to the second connecting terminal K2. A gate terminal G as a drive terminal of the transistor T1 is connected via a resistor R1, which limits the drive current of the transistor T1, to the drive input K3 for feeding in the first drive signal S1. The transistor T1 has a gate-source capacitance, which is depicted as a capacitor Cg between a gate G and a source S in FIG. 1.

A voltage limiting circuit SB is connected between the drain terminal D and the gate terminal G of the transistor T1 and, according to the invention, is fed a second drive signal S2. The voltage limiting circuit SB is configured to drive the transistor T1 by charging the gate-source capacitance Cg if a potential at the drain terminal D reaches a value at which there is the risk of the transistor T1 being destroyed. In this case, the transistor T1 is turned on in a manner driven by the voltage limiting circuit SB, thereby preventing a further rise in the drain potential or the load path voltage Uds of the transistor T1.

A voltage Udg present between the drain terminal D and the gate terminal G of the transistor is present across the voltage limiting circuit SB. The value of the voltage Udg, at which a threshold voltage of the voltage limiting circuit SB is reached and the latter is activated in order to drive the transistor T1, is variable and dependent on the second input signal S2. Preferably, at least two different threshold voltages can be set depending on the second drive signal S2.

Figure 2:
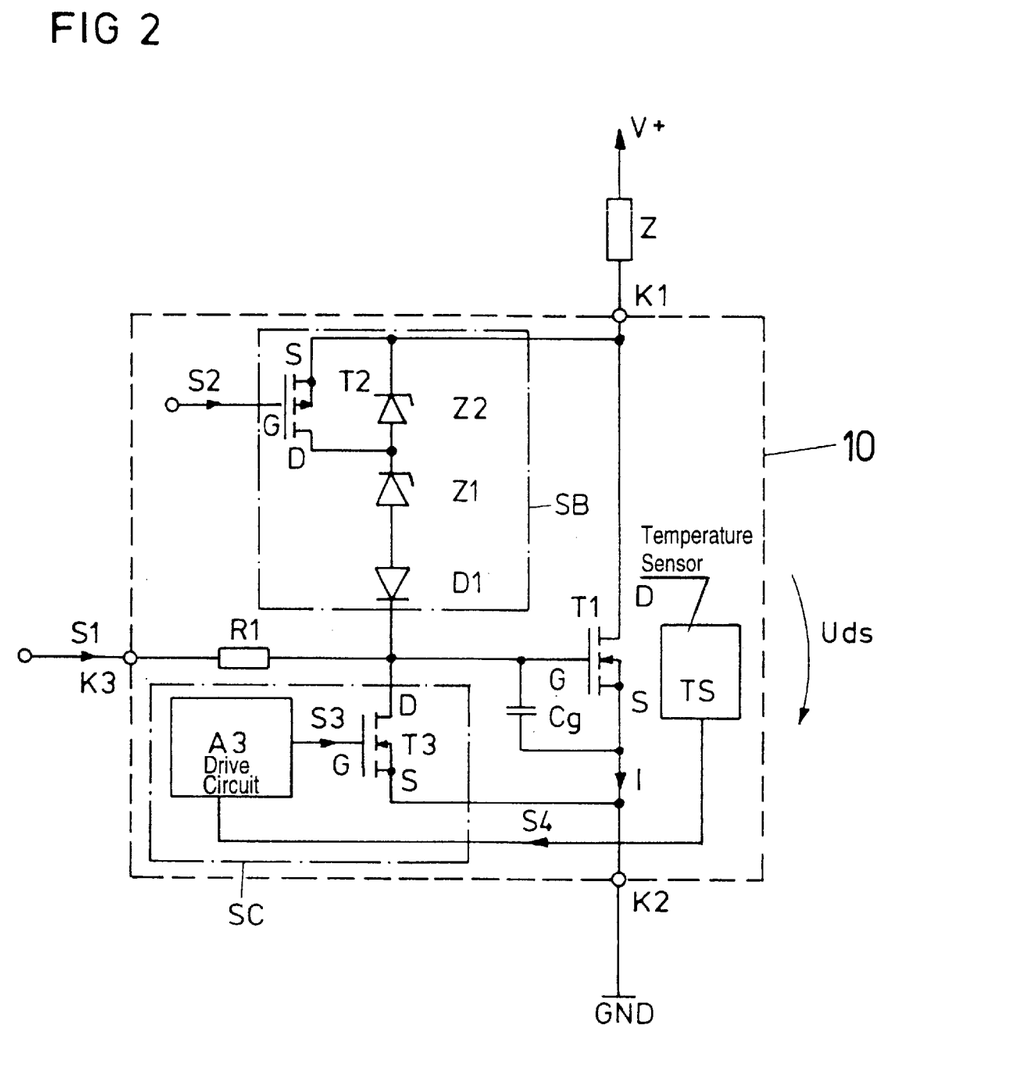
FIG. 2 is a circuit diagram of the circuit configuration according to the invention in accordance with a second embodiment, which has a further protective circuit in addition to a voltage limiting circuit.

FIG. 2 shows an exemplary embodiment of the invention in which the voltage limiting circuit SB has a series circuit containing two voltage limiting elements Z1, Z2, a first zener diode Z1 and a second zener diode Z2 in the exemplary embodiment. A second transistor T2, which is a p-channel MOSFET, is connected in parallel with the second zener diode Z2, the second drive signal S2 is fed to a gate terminal G of the second transistor T2. The two zener diodes Z1, Z2 are connected in the reverse direction between the drain terminal D and the gate terminal G of the first transistor T1. A diode D1, which is connected in series with the first and second zener diodes Z1, Z2 and is connected in the forward direction between the drain terminal D and the gate terminal G of the first transistor T1, serves for preventing a current flow from the gate terminal G to the drain terminal D of the first transistor T1.

The circuit configuration 10 in accordance with FIG. 2 furthermore has a protective circuit SC connected between the gate terminal G and the source terminal S of the first transistor T1. The protective circuit SC has a third transistor T3, whose drain-source path D-S is connected between the gate terminal G and the source terminal S of the first transistor T1. A third drive signal S3 from a drive circuit A3 of the protective circuit SC is fed to a gate terminal G of the third transistor T3. The drive circuit A3 is fed a temperature signal S4, which is dependent on a temperature in a region of the first transistor T1 and which, in the exemplary embodiment, is generated by a temperature sensor TS disposed in a manner thermally coupled to the first transistor T1.

If, in the circuit configuration 10 in accordance with FIG. 2, the second transistor T2 is turned on by the second drive signal S2, then the second zener diode Z2 is short-circuited and the first transistor T1 is turned on by the voltage limiting circuit SB when the drain potential of the first transistor T1 exceeds the value of the gate potential of the first transistor T1 for instance by the value of the breakdown voltage of the first zener diode Z1. If the second transistor T2 turns off in a manner driven by the second drive signal S2, then the first transistor T1 is turned on by the voltage limiting circuit SB if the drain potential of the first transistor T1 exceeds the gate potential for instance by a value which corresponds to the sum of the breakdown voltages of the first and second zener diodes Z1, Z2.

In this case, the switching state of the second transistor T2 is preferably dependent on the switching state of the first transistor T1, the threshold voltage of the voltage limiting circuit SB at which the voltage limiting circuit SB drives the first transistor T1 being lower when the first transistor T1 is turned on than when the first transistor T1 is turned off.

If the first transistor T1 turns on and, in this case, an over temperature occurs which is registered by the temperature sensor TS and at which the first transistor T1 is in danger of destruction, then the third transistor T3 is turned on by the third drive signal S3 generated by the drive circuit A3 in order to discharge the gate-source capacitance Cg of the first transistor T1 and thereby to turn off the first transistor T1. As a result, the load path voltage Uds of the first transistor T1 rises, in which case, given the presence of an inductive load Z or else due to the inductance of the leads to the transistor T1, the load path voltage Uds can rise considerably in a manner due to induction. In this case, if the drain potential of the first transistor T1 reaches a value which exceeds the gate potential of the first transistor T1 by the value of the breakdown voltage of the first zener diode Z1 then a current flows from the drain terminal D via the second transistor T2, the first zener diode Z1 and the diode D1 to the gate terminal G of the first transistor T1, part of the current flowing away to reference-ground potential GND via the turned-on third transistor T3.

The first zener diode Z1 unavoidably has an internal resistance which, in the event of a current permanently flowing through the first zener diode Z1, results in an additional voltage drop across the zener diode Z1, which results from the product of the internal resistance and the flowing current. The additional voltage drop results in a rise in the drain potential or the load path voltage Uds of the first transistor T1. In this case, the breakdown voltage Z1 of the zener diode is chosen such that a load path voltage Uds at which the first transistor T1 is in danger of destruction does not occur even as a result of the additional voltage rise caused by the internal resistance and the permanent current.

In addition, the first zener diode Z1 counteracts a rapid discharge of the gate capacitance Cg in order to avoid high induced voltages that can be caused by an inductive load or by the inductance of the leads. In this case, the breakdown voltage of the zener diode Z1 is dimensioned such that a further voltage rise in the load path voltage due to inductive effects does not lead to the breakdown voltage of the transistor T1 being reached.

The zener diode Z1 and the third transistor T3 are coordinated with one another in such a way that when the third transistor T3 is turned on and the threshold voltage of the voltage limiting circuit is reached, the current taken up by the zener diode Z1 is greater than the current taken up by the third transistor T3.

If the first transistor T1 turns off, then it is usually not possible for an over temperature to occur at the first transistor T1, that is to say the protective circuit for discharging the gate capacitance Cg is deactivated. In this case, a current can flow only briefly via the voltage limiting circuit SB in order to charge the gate capacitance Cg. In this case, the second switch T2 is open and the voltage limiting circuit SB turns on when the drain potential exceeds the gate potential by a value that corresponds to the sum of the breakdown voltages of the first and second zener diodes Z1, Z2. Since a permanent current flow through the voltage limiting circuit SB cannot take place in this case, there is no need to take account of an additional voltage rise due to the permanent current flow and the internal resistance of the zener diodes Z1, Z2.

Figure 3:
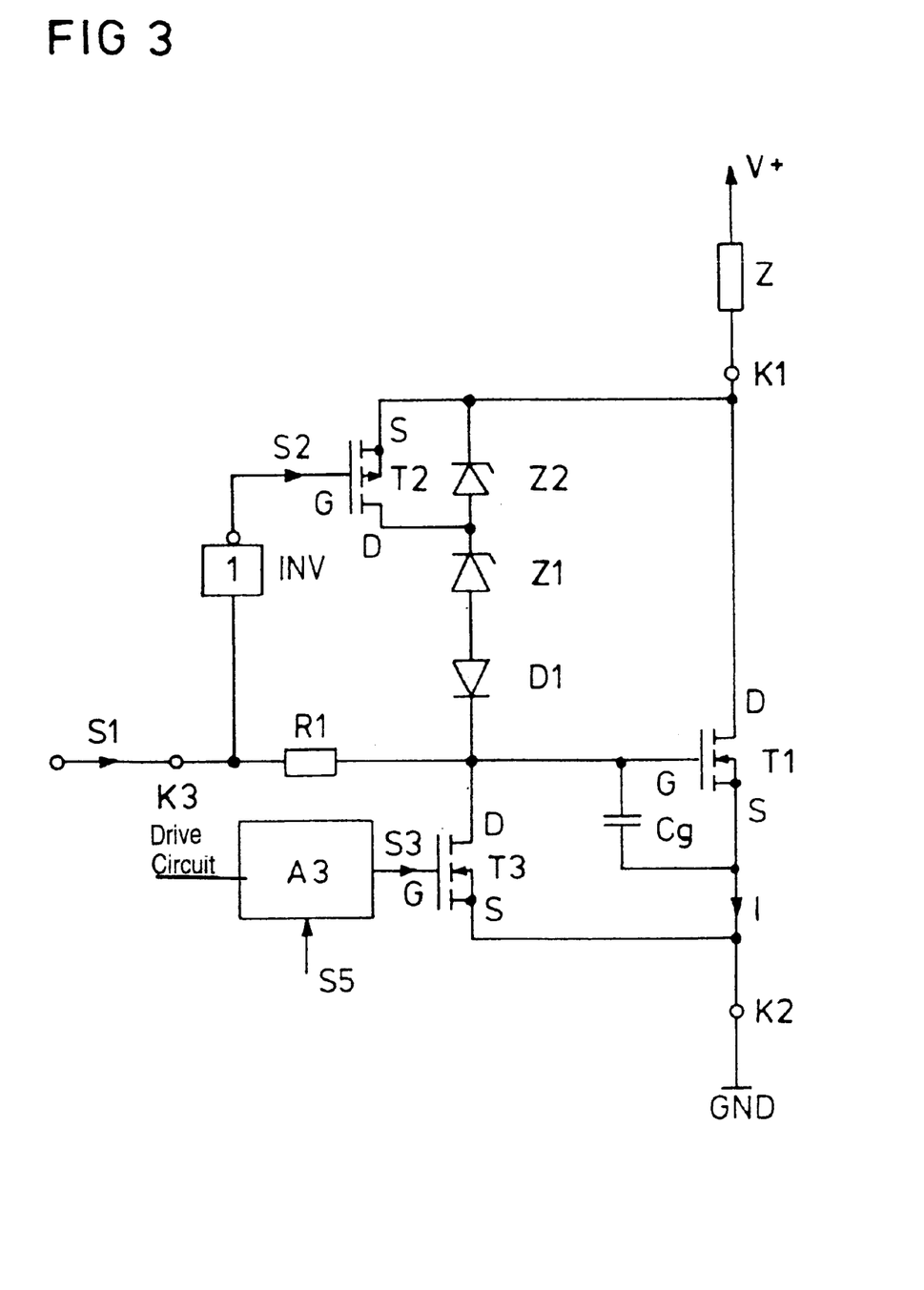
FIG. 3 is a circuit diagram of the circuit configuration according to the invention in accordance with a third embodiment.

FIG. 3 shows an exemplary embodiment of the invention in which the second drive signal S2, which is fed to the p-conducting second transistor T2 in the exemplary embodiment, is formed by inversion of the first drive signal S1 by an inverter INV. In this embodiment of the invention, it is ensured that the second transistor T2 turns on in order to short-circuit the second zener diode Z2 if the first transistor T1 turns on. The second transistor T2 turns off if the first transistor T1 turns off. The drive circuit A3 of the third transistor T3 of the protective circuit SC is fed a drive signal S5 which, in accordance with the exemplary embodiment as shown in FIG. 2, may be a signal which is dependent on the temperature in the region of the first transistor T1, or else a signal which is dependent on a load current I of the first transistor T1.

Figure 4:
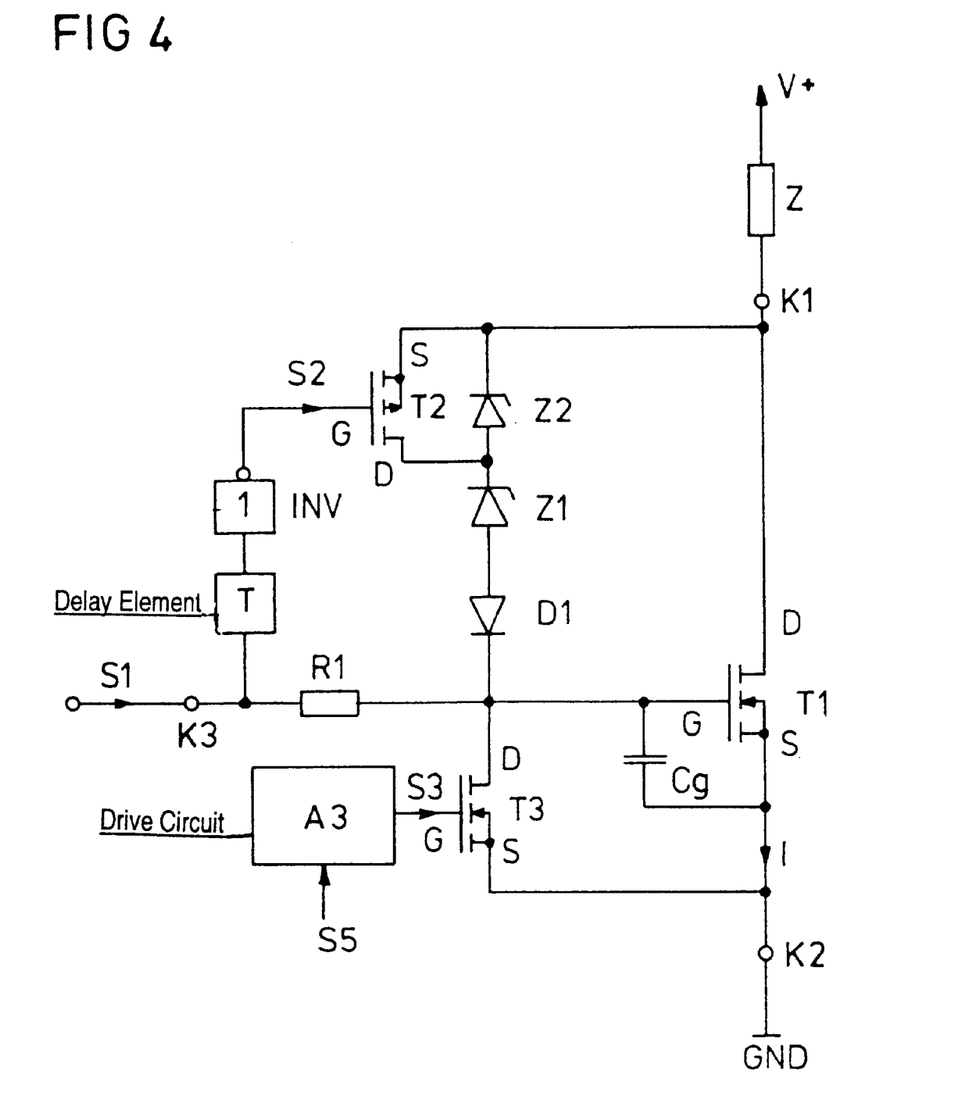
FIG. 4 is a circuit diagram of the circuit configuration according to the invention in accordance with a fourth embodiment.

FIG. 4 shows a further exemplary embodiment of the circuit configuration according to the invention, in which a delay element T is connected upstream of the inverter INV. The second transistor T2 then switches in each case in a time-delayed manner with respect to the first transistor T1.

Figure 5:
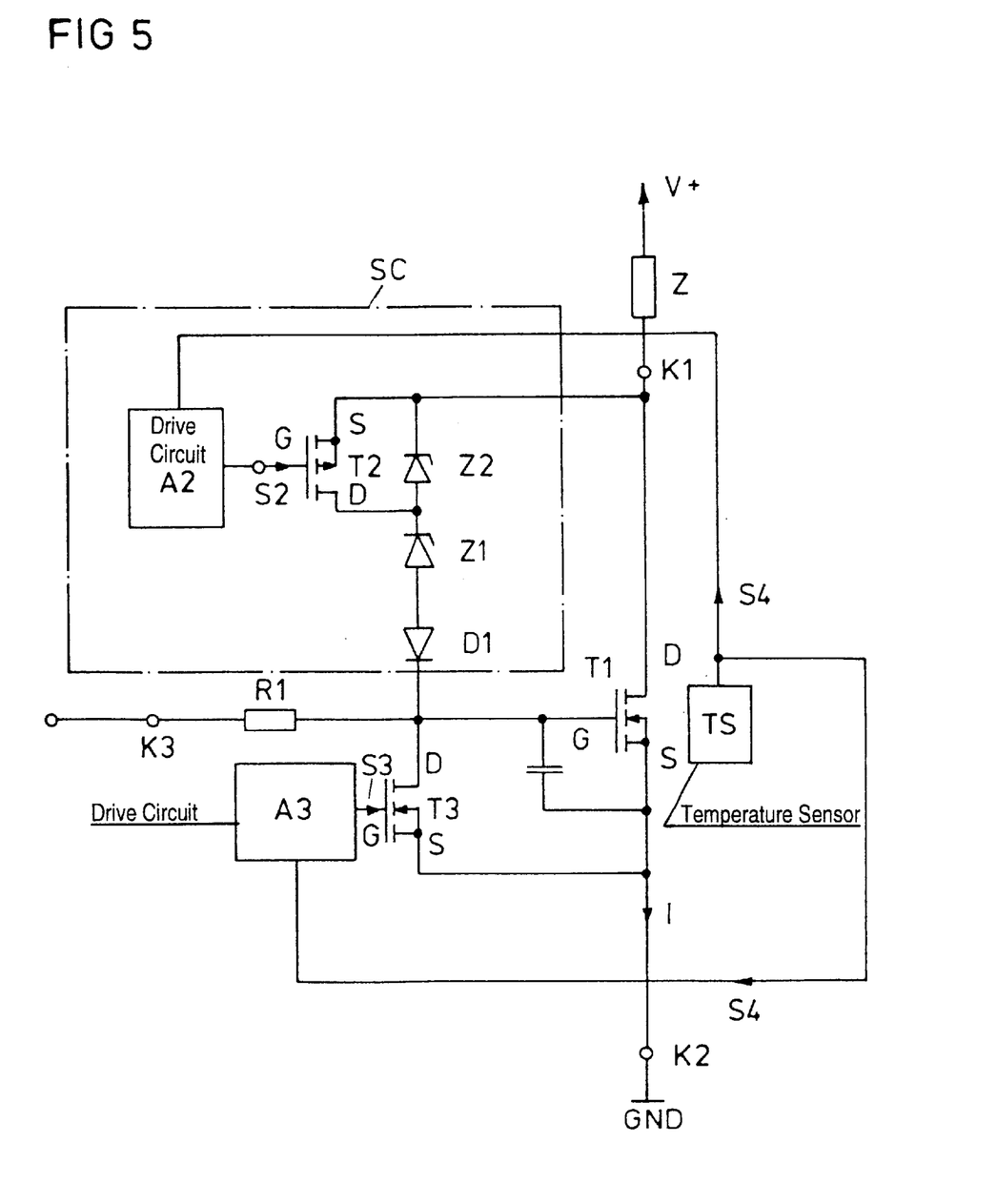
FIG. 5 is a circuit diagram of the circuit configuration according to the invention in accordance with a fifth embodiment.

FIG. 5 shows a further exemplary embodiment of the circuit configuration according to the invention, in which a drive circuit A2 is provided for generating the second drive signal S2 of the second transistor T2, which drive circuit A2, like the drive circuit A3 of the third transistor T3, is fed a temperature signal S4 dependent on the temperature in the region of the first transistor T1. The second drive circuit A2 is configured to drive the second transistor T2 if the temperature signal S4 reaches a predetermined value, which is preferably less than the value at which the third switch T3 switches on. The breakdown voltage of the voltage limiting circuit SB is reduced in this way before the third switch T3 is activated in the event of a further rise in temperature.

A further embodiment of the invention, which embodiment is not specifically illustrated, provides for the second transistor T2 and the third transistor T3 to be driven simultaneously, the second drive signal S2 resulting from the third drive signal S3 by inversion by an inverter. The breakdown voltage of the voltage limiting circuit SB is thereby reduced only when the third transistor T3 is activated.

Figure 6:
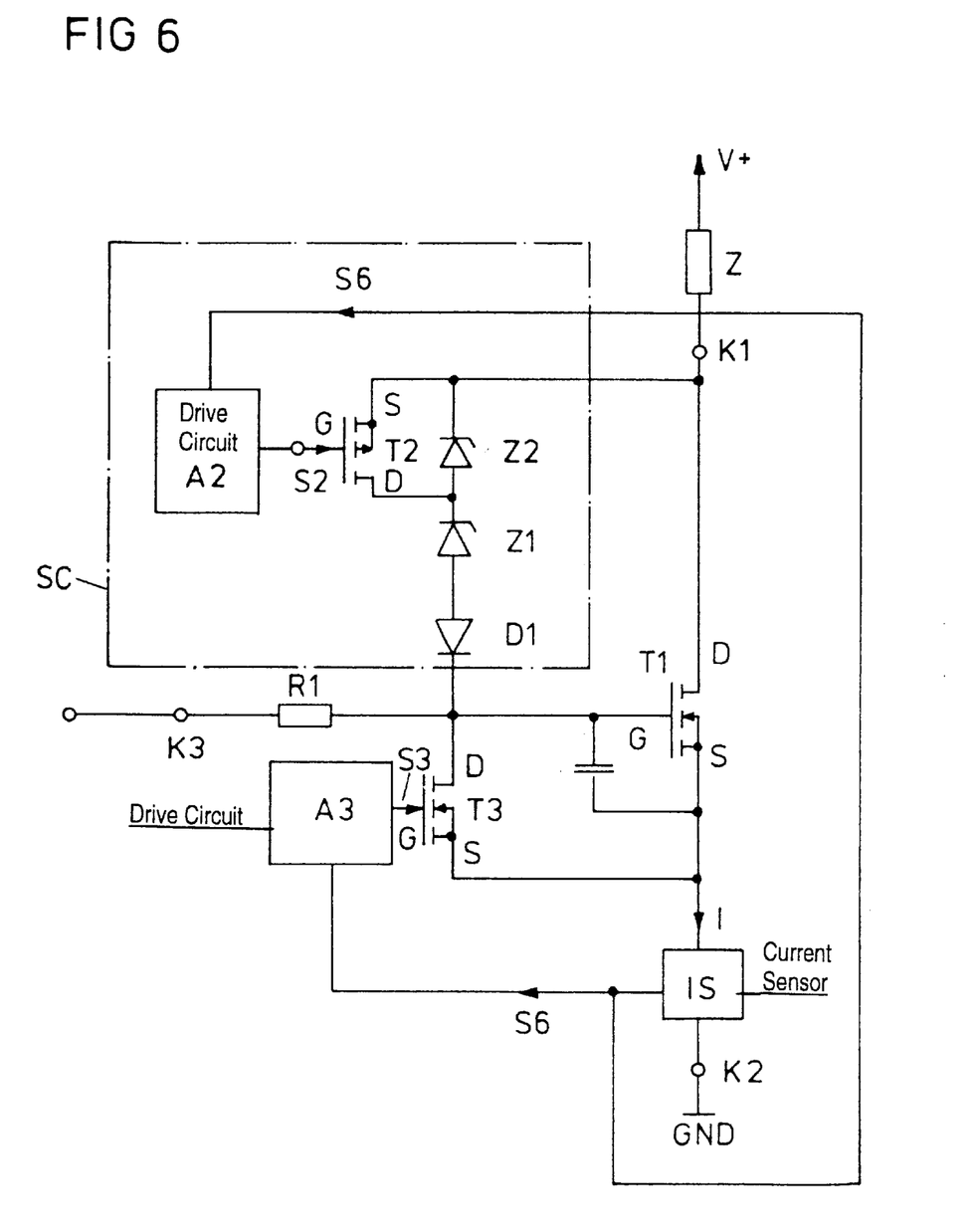
FIG. 6 is a circuit diagram of the circuit diagram of a sixth exemplary embodiment of the circuit configuration according to the invention.

Whereas in the exemplary embodiment in accordance with FIG. 5 the breakdown voltage of the voltage limiting circuit SB is dependent on the temperature in the region of the first transistor, FIG. 6 shows a further exemplary embodiment of the circuit configuration according to the invention, in which the drive circuit A3 of the third transistor T3 and the drive circuit A2 of the second transistor T2 are fed a signal S6 dependent on the current through the transistor T1. The signal S6 is generated by a current sensor IS connected in series with the first transistor T1.

I claim:

1. A circuit configuration for driving a load, comprising:
    a first connecting terminal for connecting to the load;
    a second connecting terminal;
    a first drive input for receiving a first drive signal;
    a semiconductor switching element having a first load terminal connected to said first connecting terminal, a second load terminal connected to said second connecting terminal, and a drive terminal coupled to said first drive input; and
    a voltage limiting circuit connected between said first load terminal and said drive terminal of said semiconductor switching element, said voltage limiting circuit having a second drive input receiving a second drive signal, said voltage limiting circuit having a threshold voltage being dependent on the second drive signal, said voltage limiting circuit having a series circuit containing a first voltage limiting element; and a second voltage limiting element, one of said first and second voltage limiting elements being selectively short-circuited in response to the second drive signal; and
    the second drive signal being dependent on a temperature in a region of said semiconductor switching element.

2. The circuit configuration according to claim 1, wherein at least one of said first and second voltage limiting elements is a zener diode.

3. The circuit configuration according to claim 1, including a further semiconductor switching element connected in parallel with said second voltage limiting element and said further semiconductor switching element having a drive terminal receiving the second drive signal.

4. The circuit configuration according to claim 1, wherein the second drive signal is dependent on a switching state of said semiconductor switching element.

5. The circuit configuration according to claim 4, wherein the second drive signal is dependent on the first drive signal.

6. The circuit configuration according to claim 5, including a drive circuit connected to said second drive input of said voltage limiting circuit, said drive circuit having an input and an output, the second drive signal being available at said output and a temperature signal being present at an input of said drive circuit.

7. The circuit configuration according to claim 3, including another semiconductor switching element connected between said drive terminal and said second load terminal of said semiconductor switching element, and said another semiconductor switching element having a drive terminal.

8. The circuit configuration according to claim 7, including a drive circuit connected to said drive terminal of said another semiconductor switching element.

9. The circuit configuration according to claim 8, wherein said drive circuit is fed a temperature signal that is dependent on a temperature of said semiconductor switching element.

10. The circuit configuration according to claim 8, wherein said drive circuit is fed a current signal dependent on a current through said semiconductor switching element.

11. The circuit configuration according to claim 7, wherein said semiconductor switching element, said further semiconductor switching element and said another semiconductor switching element are field-effect transistors.

* * * * *